United States Patent
Ott et al.

[11] Patent Number: 6,147,505
[45] Date of Patent: *Nov. 14, 2000

[54] ADAPTER ARRANGEMENT FOR ELECTRICALLY TESTING PRINTED CIRCUIT BOARDS

[75] Inventors: Albert Ott, Bissingen/Teck; Wilhelm Tamm, Aidlingen; Steffen Laur, Tuebingen; Volker Harr, Herzogenroth, all of Germany

[73] Assignee: Hewlett-Packard Company, Fort Collins, Colo.

[*] Notice: This patent issued on a continued prosecution application filed under 37 CFR 1.53(d), and is subject to the twenty year patent term provisions of 35 U.S.C. 154(a)(2).

[21] Appl. No.: 08/997,008

[22] Filed: Dec. 23, 1997

[30] Foreign Application Priority Data

Dec. 24, 1996 [DE] Germany ................. 196 54 404

[51] Int. Cl.⁷ .................................................. G01R 31/02
[52] U.S. Cl. ................................... 324/754; 324/757
[58] Field of Search .................................. 324/754, 755, 324/757, 758, 761, 765

[56] References Cited

U.S. PATENT DOCUMENTS

| | | | |
|---|---|---|---|
| 3,654,585 | 4/1972 | Wickersham | 439/65 |
| 4,443,756 | 4/1984 | Lightbody et al. | 324/761 |
| 4,528,500 | 7/1985 | Lightbody et al. | 324/737 |
| 4,538,104 | 8/1985 | Douglas et al. | 324/754 |
| 4,724,383 | 2/1988 | Hart | 324/754 |
| 4,870,354 | 9/1989 | Davaut | 324/754 |
| 4,896,107 | 1/1990 | Maelzer et al. | 324/754 |
| 4,977,370 | 12/1990 | Andrews | 324/761 |
| 5,012,187 | 4/1991 | Littlebury | 324/754 |
| 5,506,510 | 4/1996 | Blumenau | 324/754 |
| 5,629,630 | 5/1997 | Thompson et al. | 324/754 |
| 5,926,029 | 7/1999 | Ference et al. | 324/762 |
| 5,945,834 | 8/1999 | Nakata et al. | 324/754 |

FOREIGN PATENT DOCUMENTS

| | | |
|---|---|---|
| 0250934A2 | 6/1987 | European Pat. Off. . |
| 0369112A1 | 7/1989 | European Pat. Off. . |
| 3229448A1 | 2/1984 | Germany . |

OTHER PUBLICATIONS

Deutsches Patentamt, Jul. 30, 1997, No. 196 54 404.1.
Siemens Components 24, 1986, pp. 242–246, Klaus Beselin et al., "Testen von Flachbaugruppen mit SMD" (Month Unavailable).
Productronic 10, 1994, pp. 14, "Der drahtfreie Adapter" (Month Unavailable).

*Primary Examiner*—Safet Metjahic
*Assistant Examiner*—Russell M. Kobert

[57] ABSTRACT

An adapter arrangement for electrically testing printed circuit boards consists of two probe adapters with a uniform grid separation of the probes and two translator foils on whose sides facing the probe adapters there are contact areas with the pitch of the probe adapter. On the sides facing the printed circuit board, the arrangement of the contact areas and the contact points located thereon is the same as the grid on the printed circuit board under test. Between the translator foils a vacuum is generated with the help of rubber seals, a through hole, a valve and a suction hose. This vacuum creates a rigid package which permits good contact with the probes on both sides. The inserted support layers, which can be conventional printed circuit boards, prevent the translator foils from buckling. The various types of extremely complex printed circuit board can be electrically tested rapidly and cheaply using this arrangement. The arrangement can be employed on both double-sided and one-sided electrical test installations.

10 Claims, 8 Drawing Sheets

ADAPTER ARRANGEMENT FOR ELECTRICALLY TESTING PRINTED CIRCUIT BOARDS

FIELD OF THE INVENTION

The invention relates to an adapter arrangement for electrically testing printed circuit boards.

BACKGROUND OF THE INVENTION

In conventional testing systems, there is an adapter between the test specimen and the full-grid cassette with the test probes. This adapter has apertures at the places where the test specimen has contact points. The probes are guided through these apertures in the adapter and thus they are able, even in an inclined position, to contact the test specimen at the connection points. However, these conventional testing systems are not capable of testing printed circuit boards with high conductive-trace densities.

In DE-Z "Galvanotechnik" 87, (1996), No. 7, pp. 2358 to 2360, there is an illustration of an arrangement which enables very fine structures to be electrically tested. Under the test specimen, there is a probe adapter which has apertures at the contact points of the test specimen. Between the probe adapter and the full-grid cassette with the test probes, there is a simple printed circuit board acting as a translator. This translator has the same contact pattern on the adapter side as the test specimen. The contact pattern on the other side of the translator is that of the full-grid cassette. The contact points of the test specimen and the translator are connected through the adapter apertures by means of probes. The contact points of the upper and lower side of the translator are interconnected via conductive traces and feedthroughs. With this arrangement it is possible to perform a parallel electrical test of all contact points on the test specimen.

For the next generation of printed circuit boards, however, this variant, too, comes up against its limits. Even thinner probes in the adapter lead to very high costs or can no longer be manufactured. In addition the reliability of the contacts decreases.

Another arrangement, which can test even printed circuit boards with high conductive-trace densities, is the serial finger test system. In this system the contact points are tested one after the other for short circuit and open circuit faults. Substantially more time is required for this. Given the ever increasing number of contact points it is only possible to test the next generation of printed circuit boards using finger test systems by expending a considerable amount of time.

DE-OS 42 37 591 discloses an adapter foil having test areas with very fine structures. However, reliable contact with the test specimen is not guaranteed as each printed circuit board is slightly uneven, and the contact areas on the printed circuit board may even be displaced. For this reason too great a pressure is exerted on some connection areas, which can destroy the contact areas on the printed circuit board and the adapter foil, while on other contact areas the surface pressure is too slight, so that the contact resistance is too high, resulting in incorrect electrical measurements.

SUMMARY OF THE INVENTION

In the light of the above, the object of the invention is to create an adapter arrangement for electrically testing printed circuit boards which avoids the mentioned drawbacks of the known arrangements.

In the arrangement of the invention, all connection points are contacted simultaneously and tested in parallel to each other for short circuit and open circuit faults, even on printed circuit boards with extremely high conductive-trace densities. Thus, it is possible to electrically test multichip modules in flip chip technology and all extremely complex printed circuit boards both quickly and cheaply. With the aid of the arrangement of the invention, even printed circuit boards having a pitch to pitch separation of 200 $\mu$m can be electrically tested. This is possible since the contact areas of the test specimen are not contacted by probes, but by contact points (bumps) made from nickel-gold or another combination of metals, which are located on the flexible translator foil.

The fine grid of bumps and contact areas can be manufactured easily by chemical or galvanic deposition, by a selective sputter process, vacuum metallizing and selective etching or by other processes. The fine conductive traces which serve to translate the artwork to the probe grid are easy to generate by thin-film techniques.

Although the known arrangement according to DE-OS 42 37 591 mentioned above which has an adapter foil, possesses contact points with very fine structures on its surface, it is still not possible to achieve reliable contact. As the printed circuit board is always somewhat uneven and the contact areas of the printed circuit board may even be displaced, too great a pressure is exerted on some contact areas, which can destroy the contact points of the foil and the contact areas of the printed circuit board. Other contact areas on the test specimen and the foil are subjected to inadequate surface pressure, so that the contact resistance is too high, resulting in a faulty electrical measurement.

The invention, on the other hand, ensures reliable contacts.

The first method of achieving reliable contacts is by applying pressure pads which exert pressure from the outside onto the translator foil and thus permit a uniform contact to be established.

The second method is based on the evacuation of the space between two translator foils. This gives rise to a very rigid "package" which ensures that the test probes will exert a uniform pressure on all contact areas. If contact areas on the test specimen are staggered in height, rubber layers which become conductive when depressed can optionally be inserted into the arrangement to equalize the height variations.

According to one embodiment of the invention a one-sided adapter arrangement for electrically testing extremely complex printed circuit boards is created, with which all contact points of the conductive traces can be contacted simultaneously and the conductive traces tested parallel to each other for short circuit and open circuit faults. This one-sided arrangement comprises the following components a) to c):

a) a probe adapter with spring-loaded probes, which are fixed in a full-grid cassette:

In the electrical test, the probe adapter contacts the connection areas of the translator foil. If the printed circuit board has the same contact pattern on its surface as that of the probe adapter, it is also possible to establish direct contact.

b) one or two translator foils:

The translator foil surface facing the test specimen must possess the same contact pattern as the test specimen. In the area away from the test specimen or on the side of the foil facing the probe adapter, a pitch equal to that of the probe adapter employed is required. The expansion of the denser contact side to the contacts on the adapter side is performed on levels within the foil. Here, the conductive tracings interconnect the connection areas of the foil.

c) a pressure pad which provides a uniform counterpressure on the lower side of the translator foil and equalizes uneven areas on the printed circuit board.

According to a further embodiment of a one-sided adapter arrangement according to the invention, a rubber layer is inserted between the connection areas of the printed circuit board and the connection points of the translator foil. It is conductive at the places at which a minimum pressure is exerted. By this means displacements of the connection areas and uneven areas on the printed circuit board are equalized.

A further embodiment of the invention relates to a double-sided adapter arrangement for electrically testing extremely complex printed circuit boards, with which all test points of the test specimen can be contacted simultaneously and tested parallel to each other for short circuit and open circuit faults. This double-sided arrangement has the following components a) to d):

a) two probe adapters with spring-loaded probes, which are fixed in full-grid cassettes:

The probe adapters contact the contact areas of the translator foil in the electrical test.

b) two translator foils in which the surfaces facing the test specimen possess the same contact pattern as the test specimen:

In the area away from the test specimen or on the side of the foil facing the probe adapter, the pitch of the probe adapter used is required. The expansion of the denser contact side to the contacts on the adapter side is performed on levels within the foil. Here, the conductive tracings interconnect the corresponding connection areas of the foil.

c) rubber seals which seal the space between the translator foils:

By means of a through hole in one translator foil, a valve and a vacuum pump connected to a suction hose, a partial vacuum is generated and maintained between the translator foils. By this means uneven areas on the printed circuit board are equalized and the connection points exert a uniform pressure on the printed circuit board.

d) support layers located between the two translator foils:

These prevent the translator foils from buckling.

In a further variant of the previous embodiment rubber layers are applied between the contact areas of the printed circuit board and the contact points of the two translator foils. These rubber layers are conductive at the places at which a minimum pressure is exerted. By this means displacements of the connection areas and uneven locations on the printed circuit board are equalized.

In a further variant of a double-sided adapter arrangement two pressure pads are employed instead of the vacuum arrangement. The pressure pads exert a uniform pressure from the outside on the translator foils and on the printed circuit board. By this means uneven areas on the printed circuit board are equalized.

Furthermore, rubber layers can additionally be applied between the connection areas of the printed circuit board and the connection points of the two foils. The rubber layers are conductive at the places at which a minimum pressure is exerted. By this means displacements of the connection areas and uneven locations on the printed circuit board are equalized.

According to a further embodiment of a double-sided adapter arrangement the expansion of the denser contact side to the contacts on the adapter side can be performed on two levels within the foil. The space saving dispenses with the need for additional support layers.

In such an embodiment of the invention, rubber layers can be additionally applied between the connection areas of the printed circuit board and the connection points of the two foils. These rubber layers are conductive at the places at which a certain minimum pressure is exerted. By this means displacements of the connection areas and uneven locations on the printed circuit board are equalized.

BRIEF DESCRIPTION OF THE DRAWINGS

Embodiments of the invention are described in detail below with reference to the figures.

FIG. 1b shows a magnification of the bumps on the translator foil according to FIG. 1a;

REFERENCE SYMBOLS

Figure 1A:
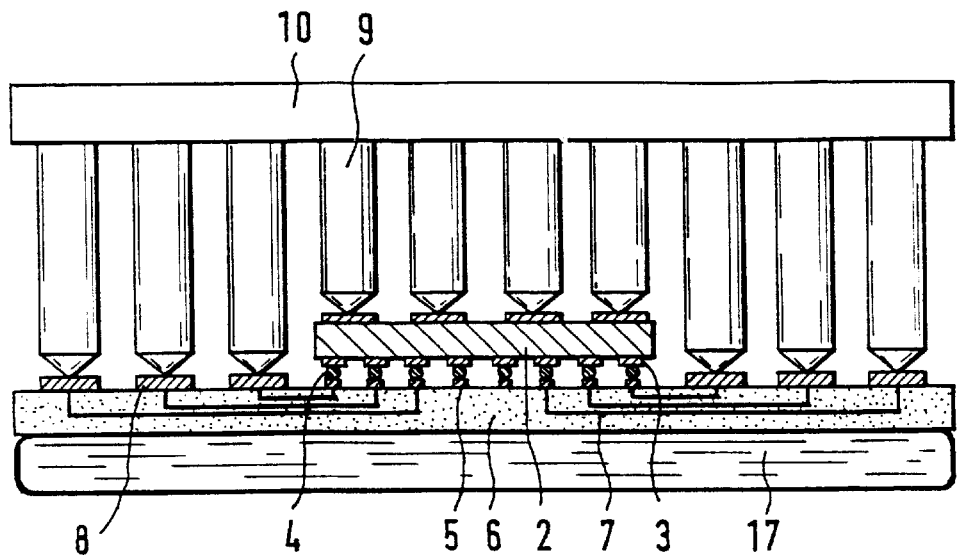
FIG. 1a shows a first embodiment of the arrangement of the invention with a probe adapter arranged on one side and a translator foil.

In FIGS. 1a to 4b the same reference symbols are used for the same component types in the various embodiments as follows:

1 Upper contacts of the test specimen;
2 Test specimen (multichip module or printed circuit board);
3 Lower contacts of the test specimen;
4 Contact bumps of the translator foil;
5 Contact areas on which the bumps are situated;
6 Translator foil;
7 Conductive tracings in the translator foil;
8 Contacts on the translator foil (on the probe adapter side);
9 Probes;
10 Probe holder;
11 Support layers (possibly FR4 board);
12 Contacts of the support layers;
13 Rubber seal;
14 Through hole;
15 Valve;
16 Suction hose;
17 Pressure pad, silicone sheath filled with liquid or gas;
18 Rubber layer which is electrically conductive when depressed;

19 Additional layer of the translator foil;
20 Support table.

DETAILED DESCRIPTION OF THE INVENTION

The printed circuit boards under test in FIGS. 1a–4a are multichip modules or extremely complex printed circuit boards which are contacted on both sides. The contact areas on the upper side of printed circuit boards 2 which are tested in FIGS. 1a–1d are arranged uniformly in the pitch of the probe adapter. At these contact areas the supply voltages and signal lines are connected once the electrical test is successful. The contact areas on the upper side of the printed circuit boards which are tested in FIGS. 2a–4b have a denser grid and have to be "expanded" by the translator foil 6 to the pitch of the probe adapter. The lower side of the boards under test possesses the contact grid of the components to be attached, which are bonded on once the electrical test is successful. It also has to be expanded to the pitch of the probe adapter by the translator foils.

The translator foil consists of an organic substrate which is between 50 and 200 μm thick depending on the application. On this foil there are metallic contact areas 5 with a diameter of about 50 μm. They are arranged in the same grid as the contact areas 3 on the printed circuit board under test and they have a diameter of about 130 μm. The difference in the diameters of contact areas 3 and 5 permit x and y tolerances to be compensated for and make the centering operation of the test specimens in the adapter cost-effective. Routing the conductive tracings 7 on a level within the translator foil permits very high test-specimen contact densities to be expanded to the pitch of the probe adapter.

In this arrangement the minimum distance from the mid-point of a contact area to the mid-point of the adjacent contact area is assumed to be about 200 μm. On the contact areas 5 there are hemispherical contact points or "bumps" 4. Like the contact areas 8, they consist of a nickel-gold layer or another metal combination. The nickel-gold combination ensures a low transition resistance and reliable contacting. The contact areas are arranged in a uniform matrix pattern of 1.27 or 2.54 mm, respectively. The pitches are determined by the probe adapters. The contact areas 5 and 8 are interconnected via conductive tracings 7 made from silver or another metal by thin-film techniques.

Routing the conductive tracings 7 on a level within the translator foil permits very high test-specimen contact densities to be expanded to the pitch of the two probe adapters (above and below). The adapters consist of a full-grid cassette 10 with spring-loaded probes 9 with a pitch of 1.27 or 2.54 mm, respectively.

The probe adapters are applied to the test specimen or the translator foil, respectively, with a slight pressure. In order to ensure a planar contact with the foil, free areas next to the test specimen are brought up to the same height as the test specimen by means of so-called support layers 11. Any uneven areas, which can now still exist between the printed circuit board 2, the support layers 11 and the translator foils 6, are equalized by evacuating the space between the foils. The rigid package thus created guarantees a uniform contact between the bumps 4 and the contacts 3 of the test specimen as well as between the probes 9 and the contacts 8 of the translator foil. Another way of equalizing unevenness consists in providing a pressure pad 17 in the form of a silicone sheath filled with liquid or gas (see FIG. 3).

If not all of the probes of the adapter are required in the electrical test, i.e. if there are spaces in the probe cushion, this gap should be filled by a pressure pad 17 (see FIG. 3). This pad acts as a hold-down device since the translator foil could buckle at these places.

Following these general explanations the figures will be explained in detail below.

The test arrangements according to FIGS. 1a, b, c and d comprise:
one or two translator foils 6 with contact areas 5, 8, hemispherical bumps 4 and conductive traces 7;
support layers 11;
to generate and maintain the vacuum: rubber seals 13, through hole 14, valve 15 and suction hose 16; pressure pad 17;
rubber layer 18 which becomes conductive when depressed.

Figure 1B:
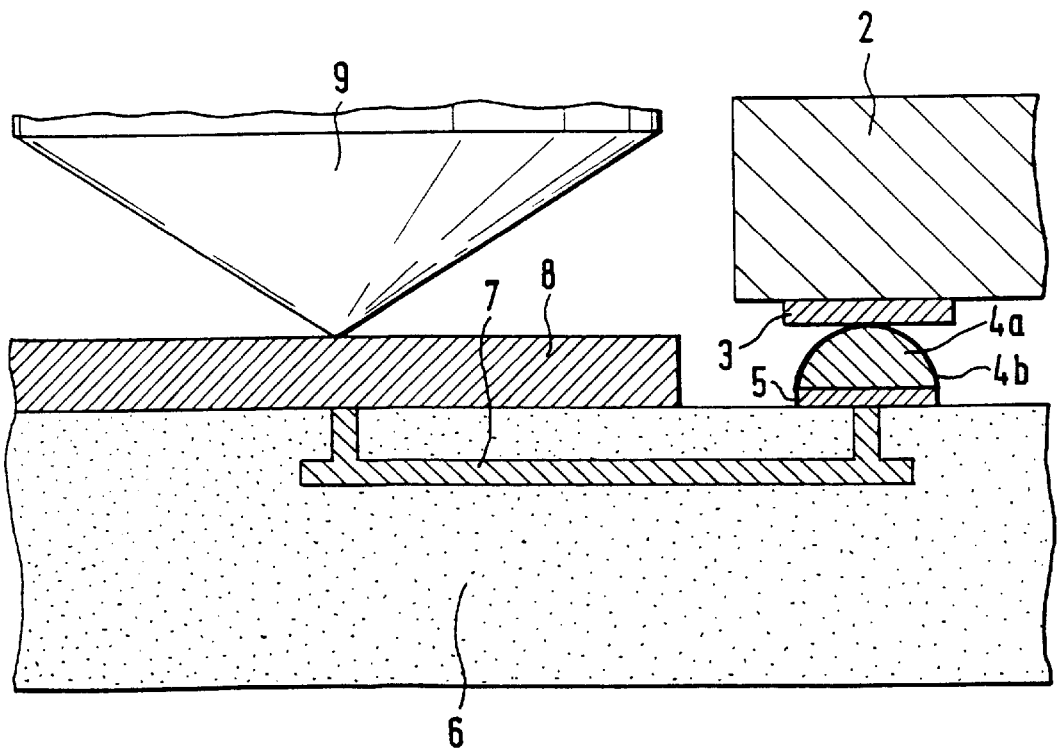

FIG. 1a shows an embodiment of the invention in which a probe adapter is arranged on one side of the test specimen 2 and on the other side there is a translator foil. FIG. 1b is a magnification of the bump on the translator foil of FIG. 1a. On the contact area 5 made of copper, platinum or another metal, a hemisphere 4a made from nickel or another metal, whose surface can also be oval-shaped, has been deposited. Onto this layer a layer of gold or other metal 4b is additionally deposited.

Figure 1C:
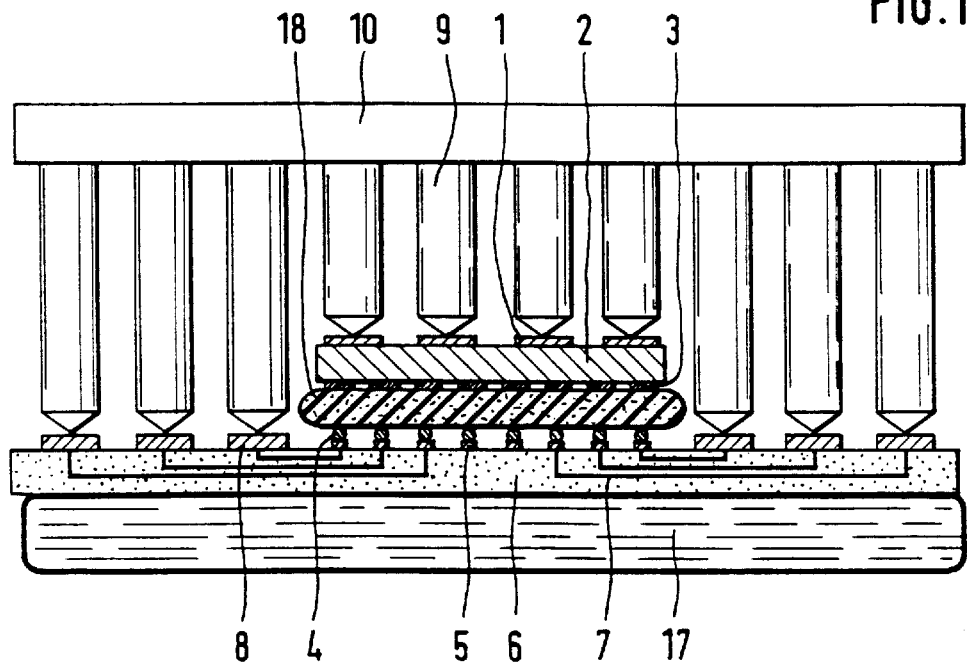
FIG. 1c shows a further embodiment of the invention with a probe adapter arranged on one side, a translator foil and a rubber layer which is electrically conductive when depressed.

FIGS. 1c shows an embodiment in which a probe adapter is arranged on one side of the test specimen 2 and, on the other side, a translator foil and a rubber layer 18 which becomes electrically conductive when depressed are arranged. In FIG. 1c the assumption is made that the contact areas 3 of printed circuit board 2 are staggered in height or that the printed circuit board is uneven. In this case the uneven areas are to be equalized and a contact ensured by using a rubber layer 18, which is conductive when depressed, next to the pressure pad 17. The rubber layer is not conductive if not depressed and begins to conduct when subjected to a minimum vertical pressure.

Figure 1D:
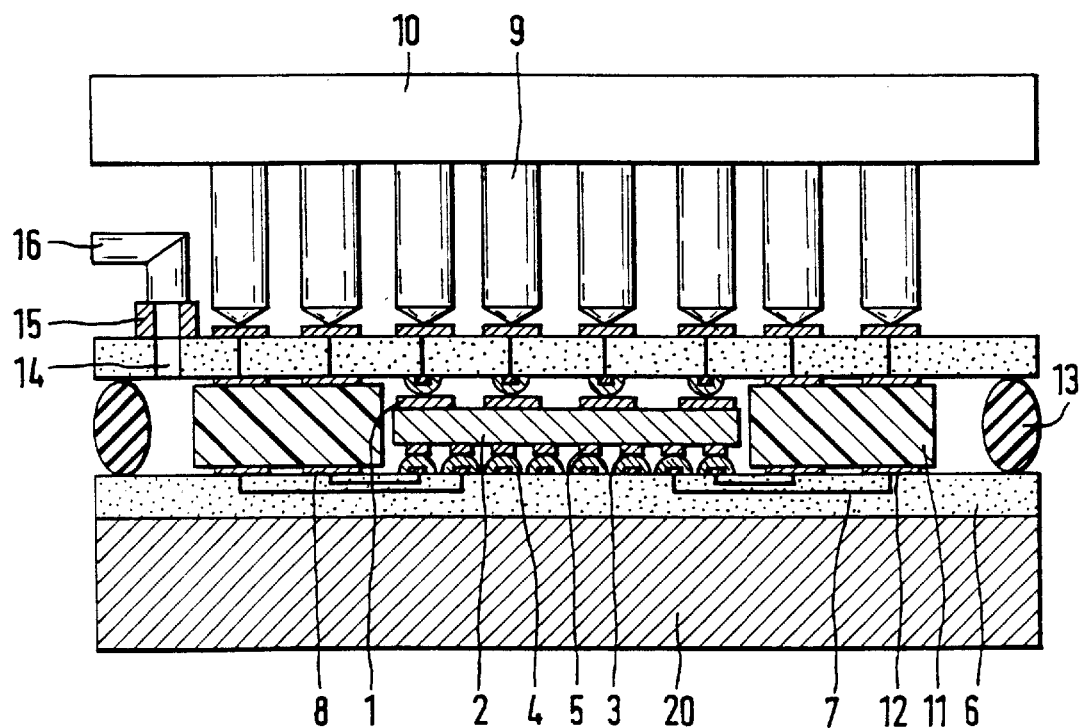
FIG. 1d shows a further embodiment with a probe adapter arranged on one side and a translator foil, under vacuum.

FIG. 1d shows an embodiment in which on one side of the test specimen 2 a probe adapter is arranged and on the other side a translator foil is arranged, with a vacuum established in the region of the test specimen. By evacuating the space between the translator foils, a stable package is obtained which permits very good contact with the probes. The vacuum is generated and maintained by means of the suction arrangement 14,15,16 and the rubber seals 13.

The contacts of the test specimen on the side facing a table 20 are tapped by bumps 4 and are expanded by the lower translator foil such that they can be bridged onto the upper translator foil by simple support layers 11 such as feedthrough FR4 printed circuit boards or polyimide sheets having the pitch of the probes. This enables both sides of the board to be tested simultaneously using a one-sided probe adapter. The contacts on the upper side of the printed circuit board are similarly tapped by bumps and conducted in the correct pitch onto the outside of the translator foil to the test probes.

Figure 2A:
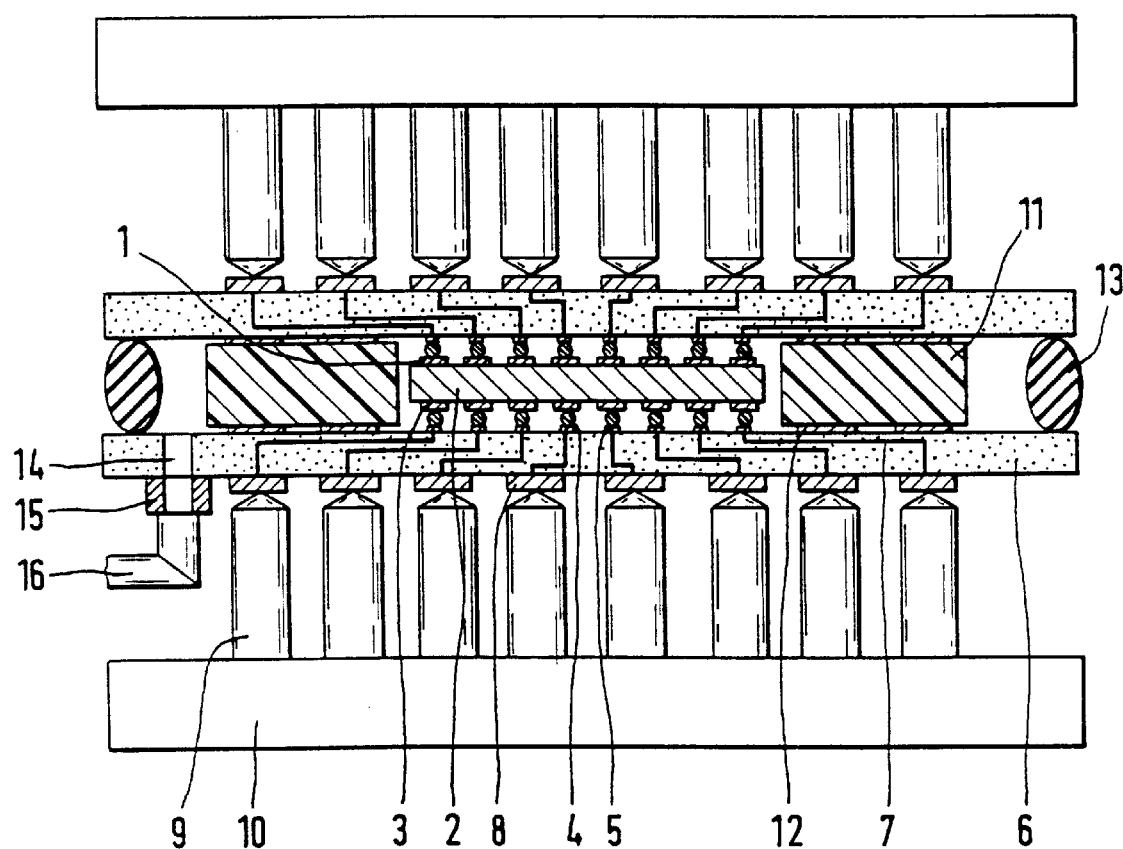
FIG. 2a shows an embodiment with probe adapters arranged on both sides and translator foils, under vacuum.
Figure 2B:
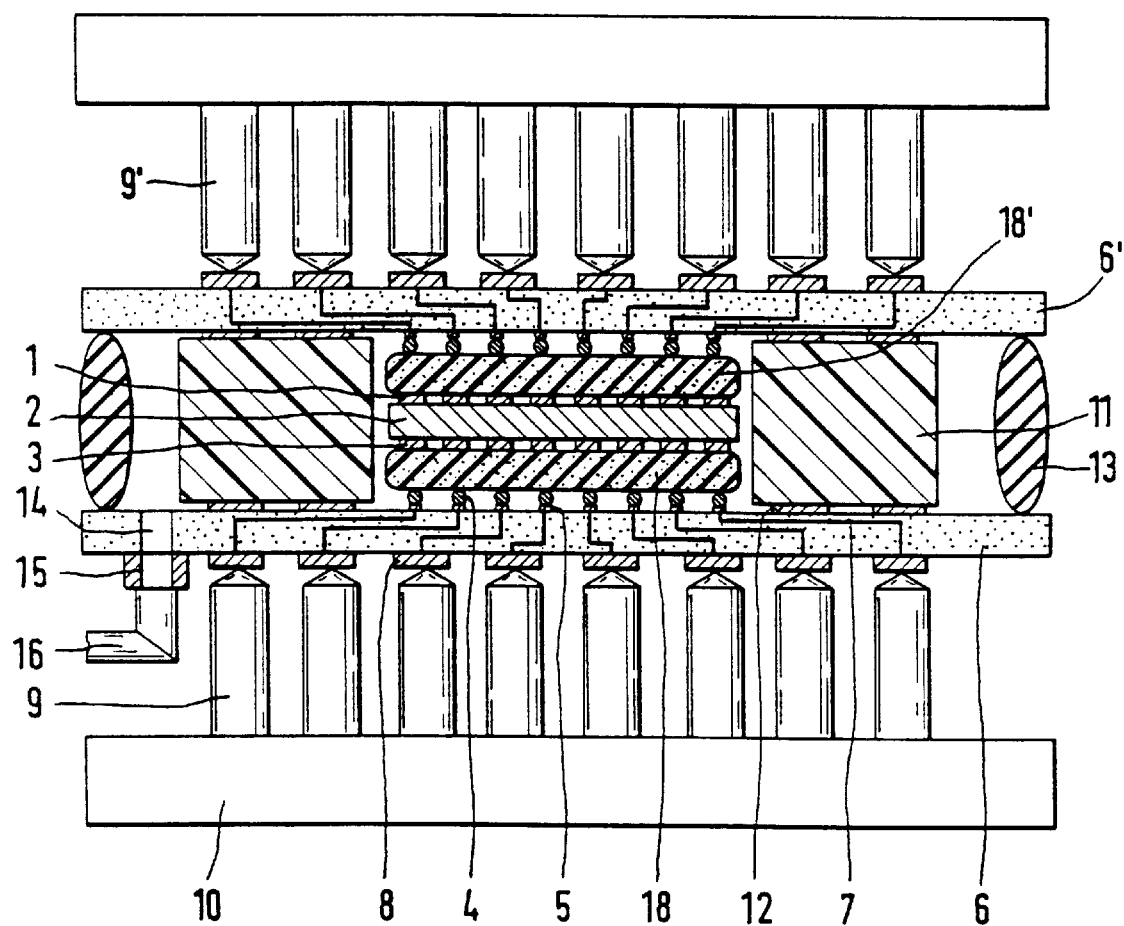
FIG. 2b shows an embodiment with probe adapters arranged on both sides, translator foils and rubber layers which are electrically conductive when depressed, under vacuum.

In FIGS. 2a, 2b electrical test fixtures are described in which multichip modules or printed circuit boards can be tested on test installations with double-sided probe adapters. Both sides of the printed circuit board are expanded, contacted and tested in a single step. This permits very fast electrical testing to be performed on complex printed circuit boards.

The test arrangements in FIGS. 2a, 2b comprise:
two translator foils 6, 6' with contact areas 5, 8, hemispherical bumps 4 and conductive traces 7;
support layers 11;
for generating and maintaining the vacuum: rubber seals 13, through hole 14, valve 15 and suction hose 16;
rubber layers 18 which become conductive when depressed.

The contact areas 1 and 3 of the test specimen 2 generally have different patterns. Thus, the patterns on the translator foils 6, 6' for the two sides also differ. By evacuating the space between the two translator foils 6, 6' a rigid package is obtained which permits very good contact with the probes 9, 9' on both sides.

FIG. 2*b* depicts an embodiment with double-sided probe adapters, translator foils and rubber layers which become conductive when depressed, under vacuum. On both sides of the test specimen 2, rubber layers 18, 18' which are electrically conductive when depressed have been inserted to equalize unevenness. The rubber layers become electrically conductive when subjected to a certain minimum pressure. The space between the translator foils is evacuated. This gives rise to a rigid package which permits very good contact with the probe adapter.

Figure 3A:
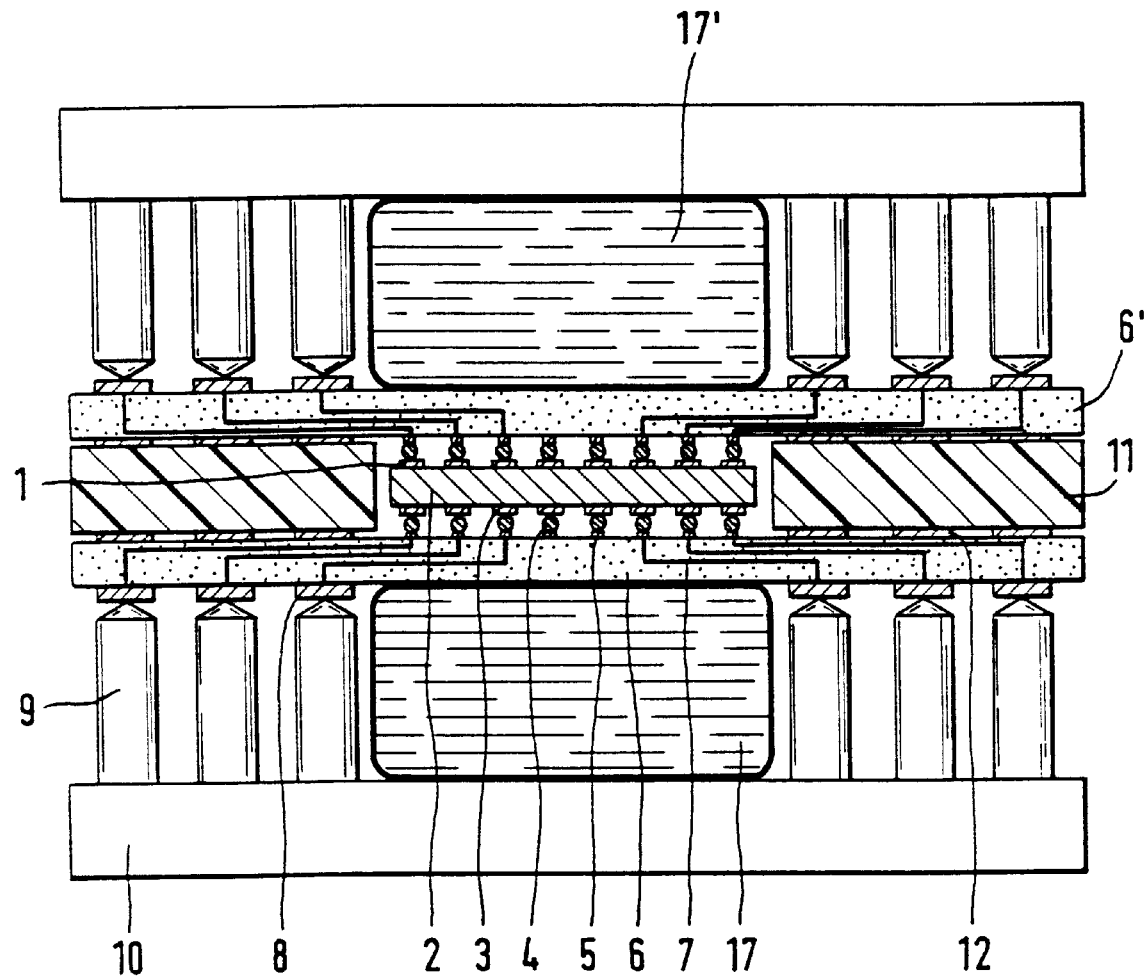
FIG. 3a shows an embodiment with probe adapters arranged on both sides, pressure pads and translator foils.
Figure 3B:
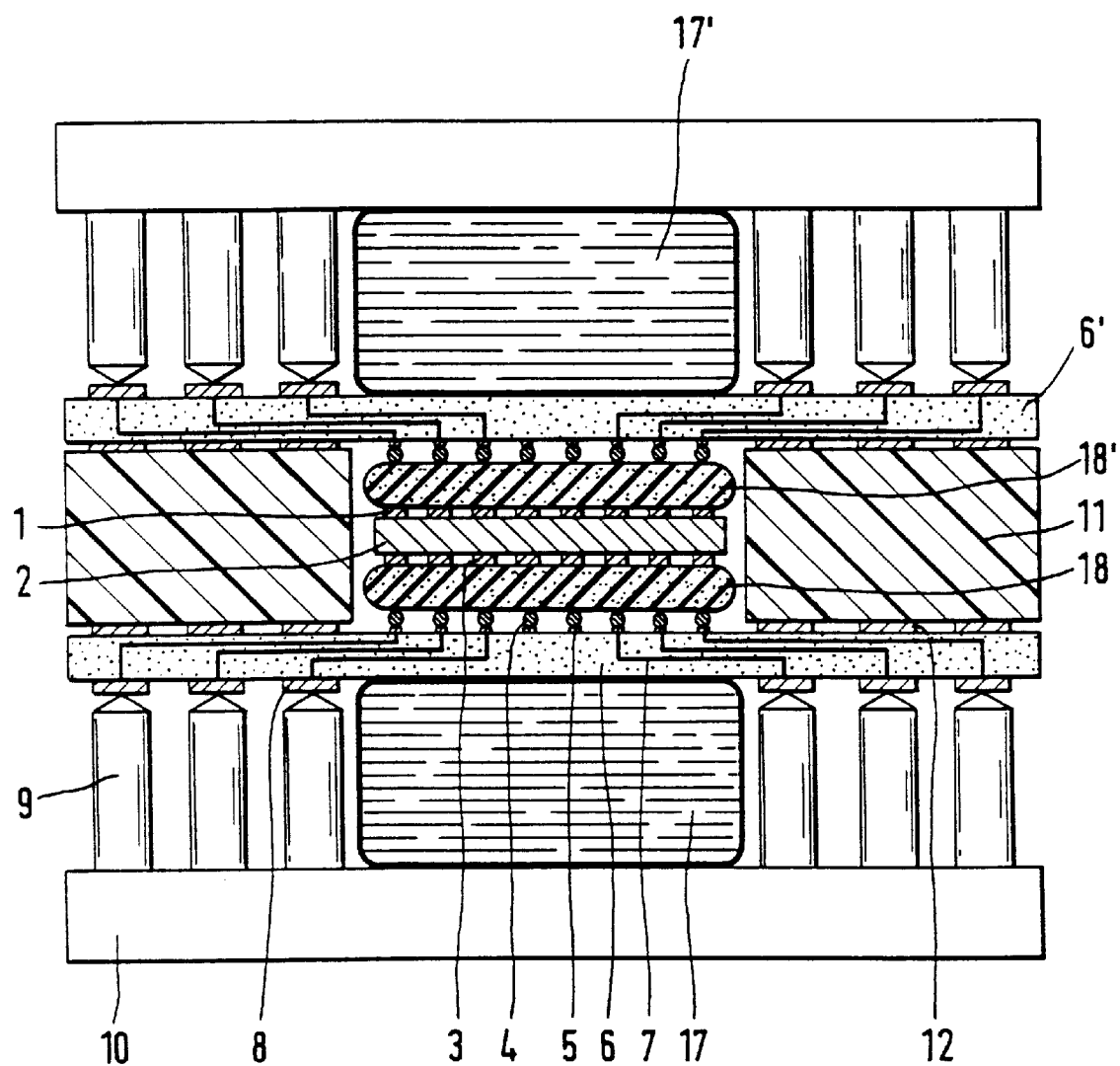
FIG. 3b shows an embodiment with probe adapters arranged on both sides, pressure pads, translator foils and rubber layers which are electrically conductive when depressed.

FIGS. 3*a*, 3*b* describe electrical test fixtures in which multichip modules or printed circuit boards can be tested on test installations with double-sided probe adapters. Both sides of the printed circuit board are expanded, contacted and tested in a single step. This permits very fast electrical testing to be performed on complex printed circuit boards.

The test arrangements in FIGS. 3*a*, 3*b* comprise:

two translator foils 6, 6' with contact areas 5, 8, hemispherical bumps 4 and conductive traces 7;

support layers 11;

pressure pads 17, 17';

rubber layers 18, 18' which become conductive when depressed.

The fixture according to FIGS. 3*a*, 3*b* differs from FIGS. 2*a*, 2*b* in that no vacuum is used in the first fixture. Thus, other measures must be used to ensure that when contacted by the probe adapters 9, 10 the bumps 4 of the translator foils 6 fit closely to the contact areas 1 of the test specimen. If not all of the probes of the adapter are now in use, i.e. if spaces arise between the foil and the adapter, these should be equalized by an additionally inserted pressure pad 17. This pressure pad consists of a silicone sheath filled with liquid or gas and acts as a hold-down device.

If there are uneven areas or height variations between the contact areas 1, 3 of the printed circuit board 2 electrically conductive rubber layers 18, 18' can be employed, which equalize the height variations. If not depressed the rubber layers are nonconductive and they begin to conduct when subjected to a certain minimum pressure.

Figure 4A:
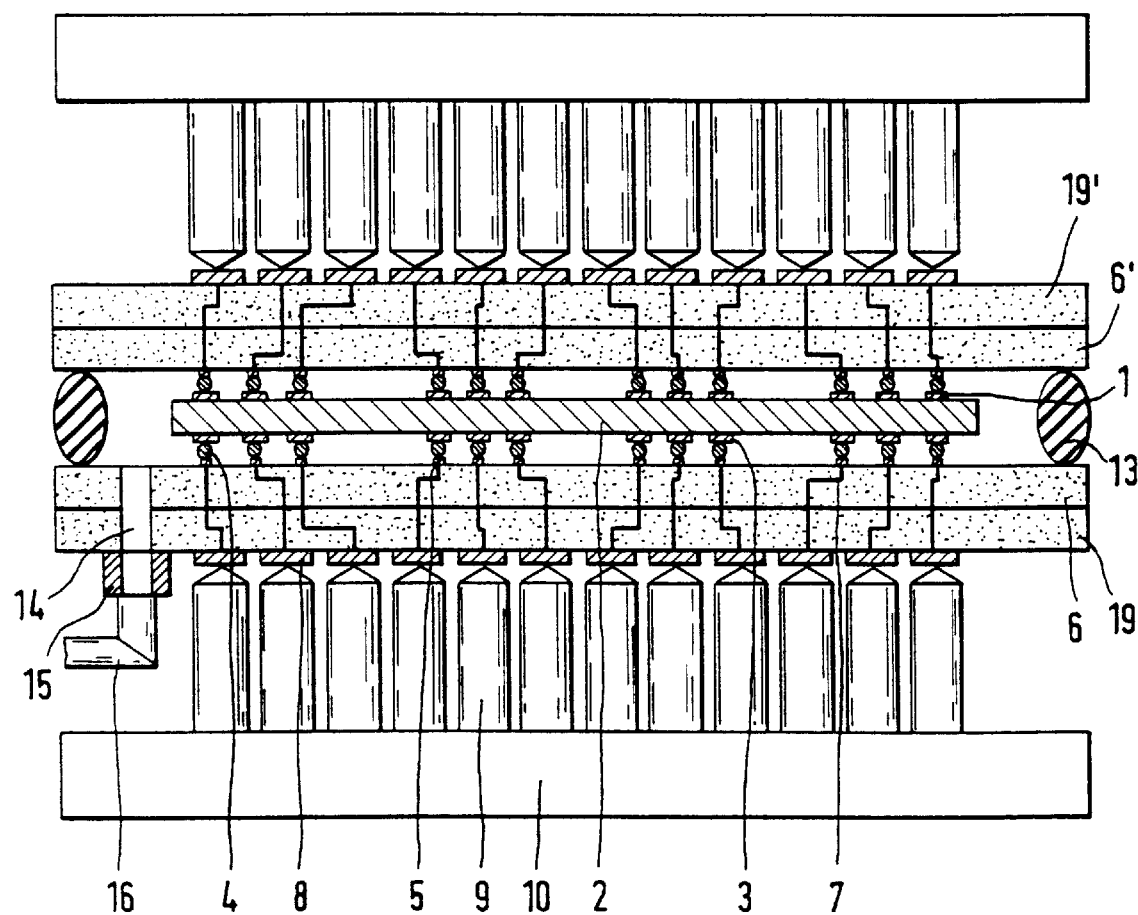
FIG. 4a shows an embodiment with probe adapters arranged on both sides and multi-layered translator foils, under vacuum.
Figure 4B:
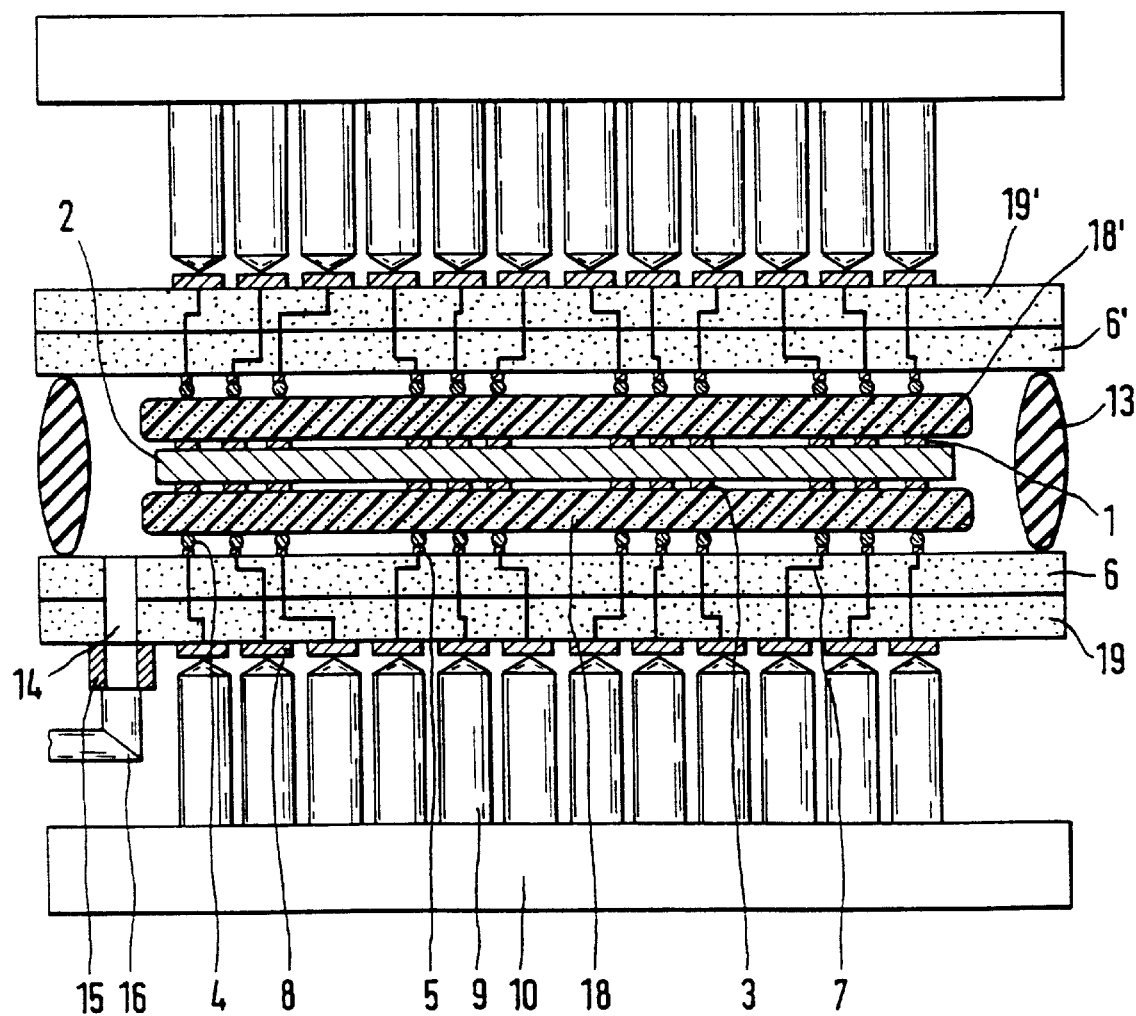
FIG. 4b shows an embodiment with probe adapters arranged on both sides, multi-layered translator foils and rubber layers which are electrically conductive when depressed, under vacuum.

FIGS. 4*a*, 4*b* describe electrical test fixtures in which multichip modules or printed circuit boards can be tested on test installations with double-sided probe adapters. Both sides of the printed circuit board are expanded, contacted and tested in a single step. The use of multi-layer translator foils enables the expansion of the test specimen's surface to be adapted to a smaller probe grid. By evacuating the space between the translator foils a rigid package is obtained which permits very good contact with the probes of the test adapter.

This fixture permits very fast electrical testing to be performed on complex printed circuit boards.

The electrical test arrangements in FIGS. 4*a*, 4*b* comprise:

two multi-layered translator foils 6, 6' with contact areas 5, 8, hemispherical bumps 4 and conductive traces 7;

for generating and maintaining the vacuum: rubber seals 13, through hole 14, valve 15 and suction hose 16;

rubber layers 18, 18' which become conductive when depressed.

Employing multi-layered translator foils 6, 19 or 6', 19', respectively, enables the expansion of the dense contact grid of the test specimen's surface to be adapted to an area which is smaller in comparison to the previous figures, or to an even finer grid.

If there are uneven areas or height variations between the contact areas 1, 3 of the printed circuit board 2 electrically conductive rubber layers 18 can be employed which equalize the height variations. When not depressed the rubber layers are nonconductive and they begin to conduct when subjected to a certain minimum pressure.

What is claimed is:

1. Adapter arrangement for electrically testing printed circuit boards, with which connection points of a printed circuit board under test can be contacted simultaneously and conductive traces can be tested parallel to each other for short circuit and open circuit faults, comprising:

a probe adapter with mechanically biased probes which are arranged in a predefined grid;

a flexible translator foil which has first connection points in a pattern of a printed circuit board under test and second connection points in said predefined grid, and further including conductive connections between the first and second connection points; and vacuum means for flexing said flexible translator foil toward said printed circuit board to establish a conforming electrical contact between the first connection points of the translator foil and corresponding connection points of the printed circuit board, wherein said mechanically biased probes are urged toward said second connection points to maintain electrical contact between the second connection points and said probes.

2. Adapter arrangement according to claim 1, wherein the vacuum means comprises:

an arrangement for generating a vacuum on both sides of the printed circuit board.

3. Adapter arrangement according to claim 1, wherein the means for establishing a reliable electrical contact comprise a pressure pad.

4. Arrangement according to claim 2, further comprising:

a rubber layer arranged between the connection areas of the printed circuit board and the connection points of the translator foil, the rubber layer becoming conductive at the places subjected to a certain minimum pressure.

5. Arrangement according to claim 1, further comprising:

probe adapters positioned on both sides of the printed circuit board; and a translator foil positioned between the probe adapter and the printed circuit board, on each side of the printed circuit board.

6. Arrangement according to claim 5, further comprising:

sealing elements for sealing a space between the translator foils;

a through hole in one of the translator foils;

an arrangement for evacuating the space between the translator foils through the through hole; and a support layer arranged between the translator foils which prevents the translator foils from buckling under vacuum.

7. Arrangement according to claim 5, further comprising:

pressure pads, each of which applies a uniform pressure from an outside region to the translator foils.

8. Arrangement according to claim 1, wherein a translator foil has a plurality of levels in which conductive tracings run.

9. Arrangement according to claim 1, wherein the mechanically biases probes comprise spring-loaded probes which are fixed in full-grid cassettes.

10. Arrangement according to claim 1, wherein the first and second connection points of the translator foil comprise hemispherical bumps with precious-metal surfaces.

* * * * *